US009666457B2

(12) United States Patent
Wang et al.

(10) Patent No.: US 9,666,457 B2
(45) Date of Patent: May 30, 2017

(54) ADSORPTION DEVICE FOR ROTATABLE HEATING

(75) Inventors: Shaoyong Wang, Shenyang (CN); Mingbo Wang, Shenyang (CN)

(73) Assignee: SHENYANG KINGSEMI CO., LTD., Shenyang (CN)

( * ) Notice: Subject to any disclaimer, the term of this patent is extended or adjusted under 35 U.S.C. 154(b) by 1027 days.

(21) Appl. No.: 13/884,440

(22) PCT Filed: Dec. 10, 2010

(86) PCT No.: PCT/CN2010/079664
§ 371 (c)(1),
(2), (4) Date: May 9, 2013

(87) PCT Pub. No.: WO2012/068751
PCT Pub. Date: May 31, 2012

(65) Prior Publication Data
US 2013/0228563 A1 Sep. 5, 2013

(30) Foreign Application Priority Data
Nov. 22, 2010 (CN) .......................... 2010 1 0555617

(51) Int. Cl.
*H05B 3/00* (2006.01)
*H01L 21/67* (2006.01)
*H01L 21/687* (2006.01)

(52) U.S. Cl.
CPC .. *H01L 21/67103* (2013.01); *H01L 21/68742* (2013.01)

(58) Field of Classification Search
CPC ........ B23K 31/02; H05B 3/00; H05B 3/0033; H05B 3/0047; H05B 3/0038; H01L 21/67; H01L 21/67098
(Continued)

(56) References Cited

U.S. PATENT DOCUMENTS 5,536,918 A * 7/1996 Ohkase ............. H01L 21/67115
118/500
5,932,009 A * 8/1999 Kim ........................ B05C 11/08
118/500

(Continued)

FOREIGN PATENT DOCUMENTS

CN 101261284 A 9/2008
CN 201171044 Y 12/2008

OTHER PUBLICATIONS

International Search Report for PCT/CN2010/079664 mailed Aug. 11, 2011 (English language ).

*Primary Examiner* — Michael Laflame, Jr.
(74) *Attorney, Agent, or Firm* — Smith, Gambrell & Russell, LLP

(57) ABSTRACT

An adsorption device for rotatable heating is provided with an adsorption heating plate, a support needle driving device, a rotary sliding ring, and a turning shaft. The adsorption heating plate is amounted at the top of the turning shaft, and a wafer is arranged at the top of the adsorption heating plate. The rotary sliding ring is connected to the turning shaft in which a vacuum channel and a connection wire channel are arranged. Support needles are connected to the output end of the support needle driving device, run through the adsorption heating plate, and are arranged at the bottom of the wafer uniformly. The adsorption device incorporates the wafer adsorption function, the wafer rotating function with controllable speed, and the heating function for heating the wafer to reach different temperatures, thereby providing adsorption and heating rotation at the same time.

16 Claims, 5 Drawing Sheets

(58) Field of Classification Search
USPC .......... 219/444.1–446.1, 390, 393, 385, 618, 219/633, 634, 635, 638, 652; 228/179.1–180.22
See application file for complete search history.

(56) References Cited

U.S. PATENT DOCUMENTS

| | | | | |
|---|---|---|---|---|
| 6,329,640 | B1* | 12/2001 | Narita | H01L 21/68 118/730 |
| 6,722,642 | B1* | 4/2004 | Sutton | B25B 11/005 269/21 |
| 6,910,613 | B2* | 6/2005 | Narita | H01L 21/67138 228/41 |
| 7,060,939 | B2* | 6/2006 | Shinya | H01L 21/67098 118/50.1 |
| 7,726,546 | B2* | 6/2010 | Maeda | B23K 1/0016 228/180.22 |
| 2003/0047551 | A1* | 3/2003 | Worm | B08B 7/0021 219/390 |
| 2011/0236598 | A1* | 9/2011 | Kumagai | C23C 16/45536 427/569 |

* cited by examiner

ADSORPTION DEVICE FOR ROTATABLE HEATING

TECHNICAL FIELD

The application is an adsorbing apparatus combining rotating and heating function involved in semiconductor equipment field and used for wafer process treatment. The application applies mostly to coating equipment, developing equipment, cleaning equipment, etching equipment, etc. Sparying process is essential for process such as TSV, MEMS especially.

BACKGROUND

Associated with the variation of semiconductor process at present, many processes within equipment are getting more complicated. Wafer state requirements are more complicated in the manufacturing process. Many process demands adsorbing and rotating function when the wafer is heating. The limitations of heating will cause trouble for rotating, meanwhile it turns into even more difficult for vacuum adsorbing combining heating and rotating. If the process was conducted step by step, it would result in the whole wafer processing existing various defect. Thus it can't meet the process requirements.

SUMMARY

The application is an adsorbing apparatus combining rotating and heating function involved, it solves several current technological limitations, including adsorbing coupled with rotating and heating simultaneously. The apparatus assembled the functions of adsorbing wafer, rotating wafer at adjustable speed, heating wafer can be achieved in varying degree according to the requirements. The apparatus solves the above problem completely.

The Advantages and the Beneficial Effects of the Application are:

1. Wafer loading is completed by up and down movement of pin. Wafer after loading is totally attaching to the adsorbing hotplate. The adsorbing hotplate top surface is digged some grooves that are connected with vacuum channel in the rotating shaft. The adsorbing hotplate adsorb wafer is by means of vacuum. The heating module that is installed inside the adsorbing hotplate can control the adsorbing hotplate to the specified degree. Thus the heating wafer can be achieved in specified degree. The driving mode of the rotating shaft is motor driving that drives the whole adsorbing hotplate and wafer rotating together. The cable of the adsorbing hotplate and temperature sensor complete the rotating function through the conductive rotating ring.

2. The Gas Path and electric circuit insulation of the application work separately, which leads to the accurate control for wafer temperature and optional rotating function.

3. The application has advantages of rational structure, steady performance, convenient maintenance, multi-function, etc. It can meet a variety of process and apply to all kinds of semiconductor devices

Figure 1:
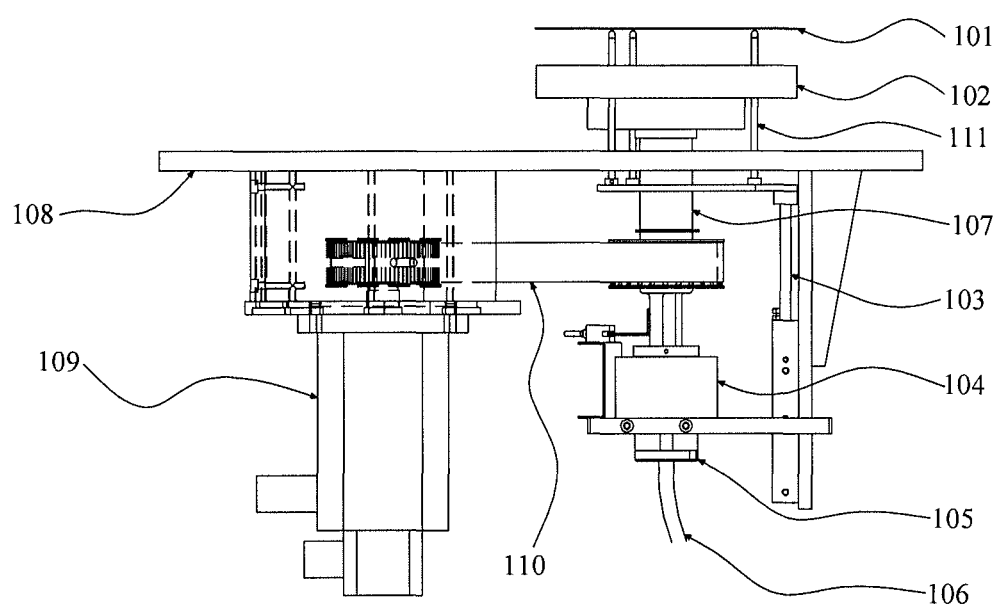
FIG. 1 is a diagram of the overall structure.

101. wafer; 102. adsorbing hotplate; 103. pin driving device; 104. conductive rotating ring; 105. vacuum sealing equipment; 106. vacuum lines; 107. rotating shaft; 108. Substrate; 109. rotating motor; 110. transmission mechanism (belt gear); 111. pin; 201. reset sensor; 301. pin through-holes; 302. groove; 303. vacuum channel I; 401. heating plate; 402. heating wire; 501. cable channel; 502. vacuum channel II; 503. temperature sensor.

DETAILED DESCRIPTION

As shown in FIGS. 1-5, the application is an adsorbing apparatus combining rotating and heating function. The apparatus includes: wafer 101; adsorbing hotplate 102; pin driving device 103; conductive rotating ring 104; vacuum sealing equipment 105; vacuum lines 106; rotating shaft 107; Substrate 108; rotating motor 109; transmission mechanism(belt gear) 110; pin 111, etc. The specific structure is as follows:

The lower part of the Substrate 108 has a rotating motor 109 and a pin driving device 103. The upper part of the Substrate 108 has an adsorbing hotplate 102. A rotating motor 109 is connected with a rotating shaft 107 through a transmission mechanism (belt gear) 110 at output terminal. The rotating shaft 107 is connected with the adsorbing hotplate 102 in top, a wafer 101 placed on the hotplate 102. A conductive rotating ring 104 is connected with rotating shaft 107 through screws. The rotating shaft 107 has vacuum channel II 502 and cable channel 501. The vacuum channel II 502 is connected with vacuum line 106, sealed through vacuum sealing equipment 105 in the vacuum channel II 502 and the vacuum line 106 connections. The pin driving device 103 is connected with three or more pins 111 at output terminal. The pins 111 go through the adsorbing hotplate 102. The pins 111 can distribute under the wafer 101 uniformly. Pins 111 can go through adsorbing hotplate 102 by up movement, while Pins 111 can load wafer onto the adsorbing hotplate 102 by down movement.

Figure 2:
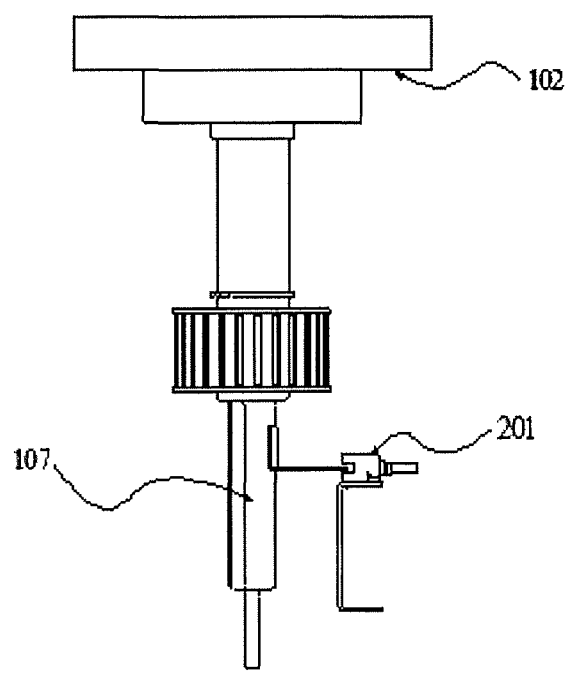
FIG. 2 is a diagram of the adsorbing hotplate and the reset sensor beside the rotating shaft.

Referring to FIGS. 1 and 2, the apparatus loads reset sensor 201 in the rotating shaft 107 lateral, in order to prevent motor not resetting after turning. Each time, the rotating shaft 107 is driven by the synchronous belt of transmission mechanism (belt gear) 110, which is rotated by the rotating motor 109. The rotating motor 109 detects the standing angle, after driving rotating of the rotating shaft 107, in order to avoid resulting in interference for wrong places, when pins 111 go through wafer 101 by up movement.

Figure 3:
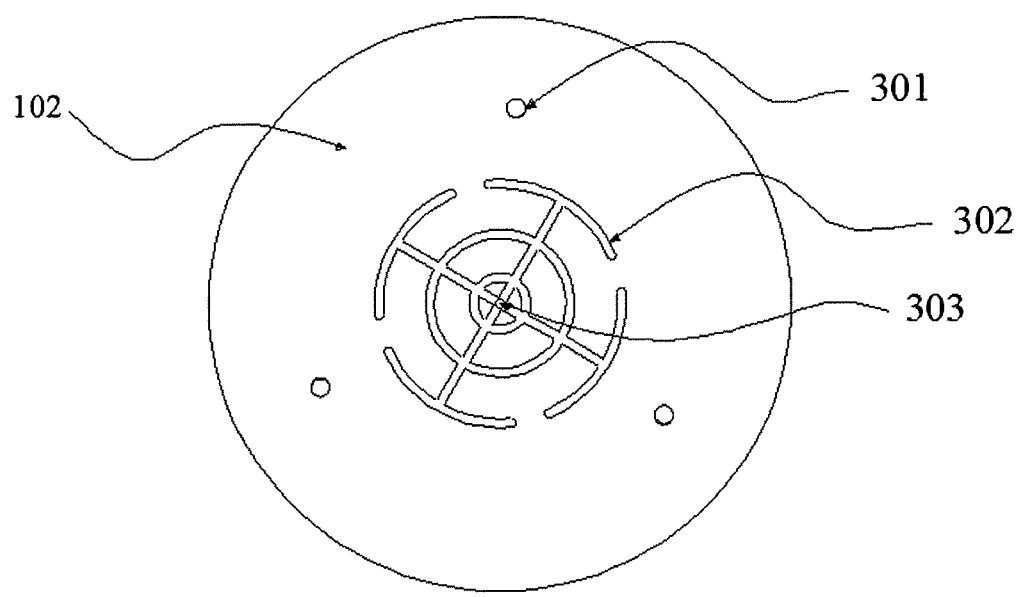
FIG. 3 is a diagram of upper surface of the adsorbing hotplate.

Referring to FIG. 3, the adsorbing hotplate 102 top surface is round, square or irregular shape according to the actual situation. There are some grooves 302 on the surface of the adsorbing hotplate 102, whose depth are 0.2 mm-3 mm, and width are 0.5 mm to 5 mm (as the standard that without obvious distortion after the wafer being adsorbed). Groove 302 is connected with vacuum channel I 302 in the adsorbing hotplate 102, that is used for adsorbing and fixing wafer 101. Vacuum channel I 303 is connected with vacuum channel II 502 within the rotating shaft 107. The adsorbing hotplate 102 includes at least three pin through-holes 301 which are channels for pins 111 to move through the up and down movement to realize the wafer loading. The diameter of the vacuum channels I 303 is 2-10 mm. In order to prevent the influence for the temperature uniformity when the adsorbing hotplate 102 is heating the wafer 101, the pin through-holes must be as small as possible.

The shape of the adsorbing hotplate 102 matches the processing wafers. The size of the adsorbing hotplate surface must be less than or equal to the processing wafers. Thus it can prevent the heat loss of the adsorbing hotplate 102, and acquire good control of the surface temperature. Additionally it can effectively prevent the pollution for the adsorbing hotplate 102 through the processing.

Figure 4:
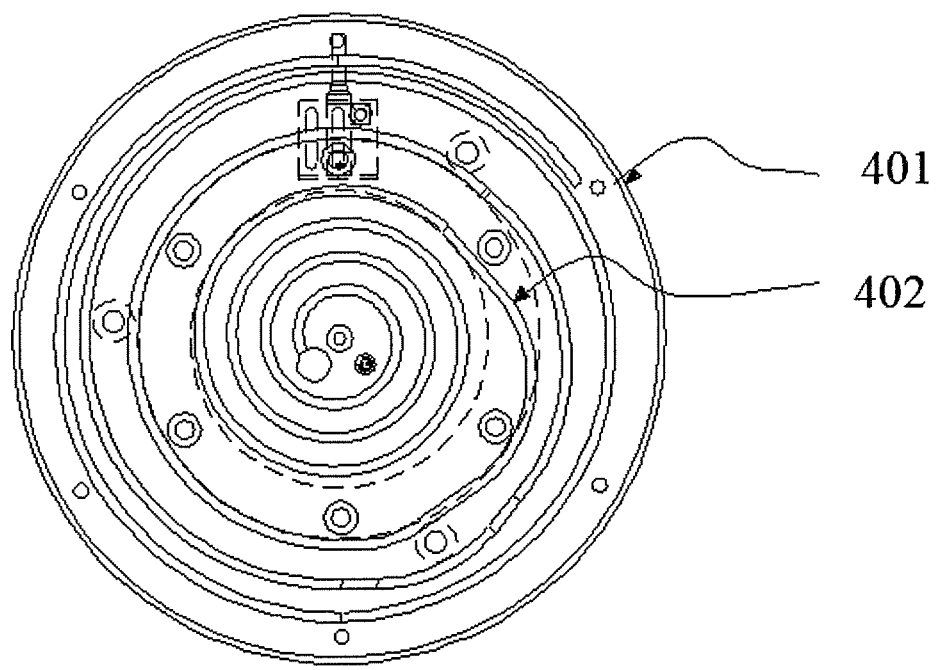
FIG. 4 is a diagram of inner structure of the adsorbing hotplate.

As shown in FIG. 4, the adsorbing hotplate 102 internal includes heating plates 401. The heating wire 402 uniformly coiled in the heating plate 401 for uniform heating. The center hole of the heating plate 401 is vacuum channel which are sealed through heatproof sealed rings. The temperature of the adsorption heat plate is controlled within the range of 50° C.-200° C.

Figure 5:
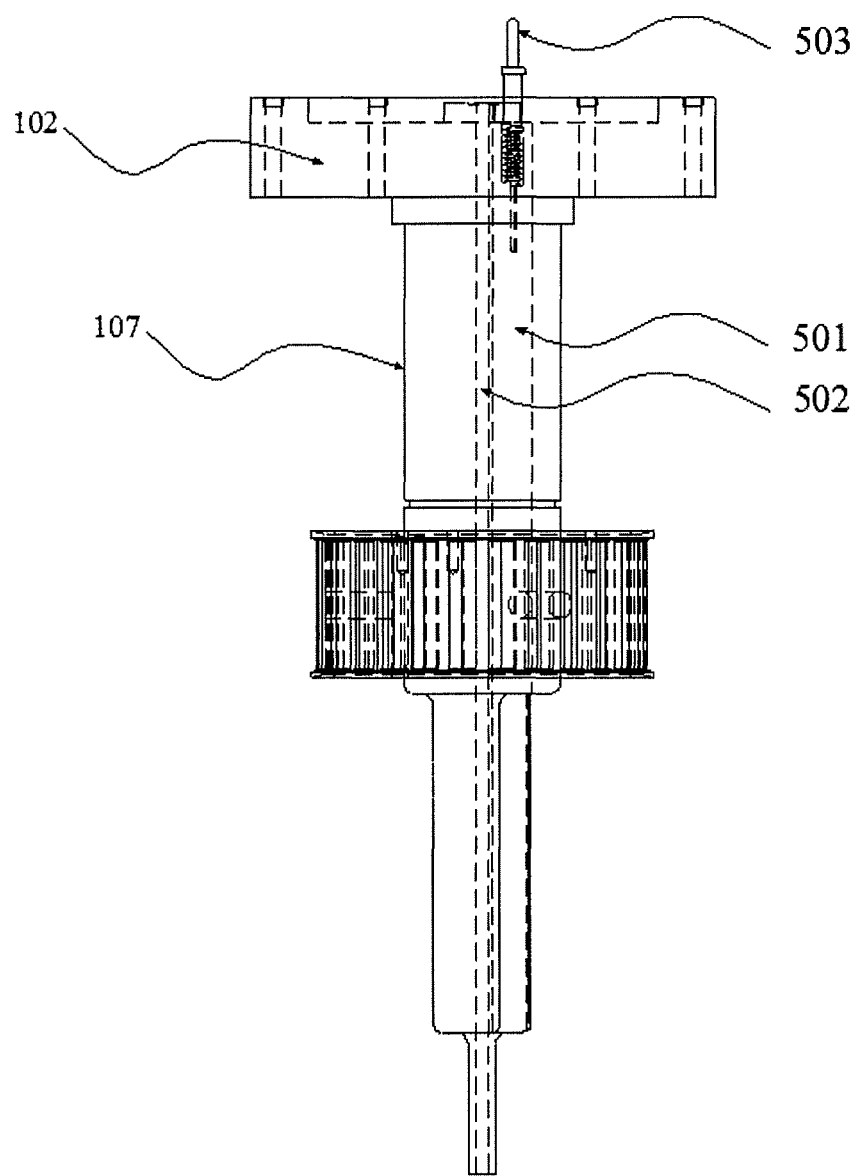
FIG. 5 is a diagram of vacuum channel and cable channel within rotating shaft

Referring to FIGS. 1 and 5, the major part for connecting the whole apparatus is the rotating shaft 107. The rotating motor 109 drives transmission mechanism (belt gear) 110, then the whole apparatus starts rotating by driving the rotating shaft 107. The rotating shaft has two channels: vacuum channel II and cable channel. As the cable and vacuum line cannot rotate limitlessly, the application solves this problem by the conductive rotating ring 104. The heating cable and temperature sensor cable within the heating plate 401 export through the conductive rotating ring 104. Heating cable and temperature sensor cable within the heating plate 401 achieve rotation through the conductive rotating ring 104. The overall rotating vacuum channel as well as the heating cable and temperature sensor cable within the heating plate 401 are all in the rotating shaft 107.

The working processes of Disclosed are as follows:

Heat the adsorbing hotplate 102 to the specified temperature. Temperature sensor 503 is used to text real-time temperature of the adsorbing hotplate 102; Open the vacuum lines 106, and start the rotating motor 109 to make the motor reset; Start the pin driving device 103 to make the pins 111 be on the rise; Place wafer 101 onto the pins 111. Make the center of the wafer 101 and the center of the adsorbing hotplate 102 overlap as much as possible; Start the pin driving device 103 to make the pins 111 be on the decline,; load wafer 101 onto the adsorbing hotplate 102; heat the adsorbing wafer 101, and then start the process.

End the process, and close the vacuum lines 106; Start the pin driving device 103 to make the pins 111 are on the rise, and unload wafer 101; Start the pin driving device 103 to make the pins 111 are on the decline, and start the rotating motor 109 to make the motor reset, and restart the process.

The invention claimed is:

1. An adsorbing apparatus combining a rotating function and a heating function, comprising:
   an adsorbing hotplate for adsorbing and heating a wafer, the adsorbing hotplate comprising a heating plate having a heating wire uniformly coiled in the heating plate and a heating cable extending out of the adsorbing hotplate, a temperature sensor with a temperature sensor cable extending out of the adsorbing hotplate, and a first vacuum channel extending through a center of the adsorbing hotplate;
   a pin driving device for driving up and down movement of pins for loading and unloading the wafer, the pins being arranged to pass through the adsorbing hotplate and uniformly distribute under the wafer;
   a rotating shaft for rotating the adsorbing hotplate, the rotating shaft comprising a second vacuum channel that communicates with the first vacuum channel of the adsorbing hotplate and a cable channel that receives lengths of the heating and temperature sensor cables that extend out of the adsorbing hotplate; and
   a conductive rotating ring connected with the rotating shaft, the conductive rotating ring comprising a gas path connecting the second vacuum channel of the rotating shaft with a vacuum line, and an electric circuit connecting the heating and temperature sensor cables with a power source.

2. The apparatus according to claim 1, further comprising:
   a rotating motor and a transmission mechanism, the rotating motor being connected with the rotating shaft through the transmission mechanism.

3. The apparatus according to claim 1, wherein the connection between the second vacuum channel of the rotating shaft and the vacuum line is sealed through vacuum sealing equipment in the second vacuum channel and the vacuum line.

4. The apparatus according to claim 2, further comprising a reset sensor for resetting the rotating motor.

5. The apparatus according to claim 1, wherein a top surface of the adsorbing hotplate is round, square, or irregular shape, and there being grooves on the top surface having a depth of 0.2 mm to 3 mm and a width of 0.5 mm to 5 mm; the grooves communicating with the first vacuum channel of the adsorbing hotplate.

6. The apparatus according to claim 1, wherein the adsorbing hotplate comprises at least three pin through-holes which are channels for up and down movement of the pins, the pin through-holes having a diameter of 2 mm to 10 mm.

7. The apparatus according to claim 1, wherein a shape of the adsorbing hotplate matches a shape of the processing wafer; and a size of the adsorbing hotplate surface is less than or equal to a size of the processing wafer.

8. The apparatus according to claim 1, wherein the first vacuum channel of the adsorbing hotplate is sealed with a heatproof sealed ring.

9. The apparatus according to claim 2, wherein the rotating motor is laterally spaced from the rotating shaft such that the transmission mechanism extends laterally between the rotating motor and the rotating shaft.

10. The apparatus according to claim 9, wherein the transmission mechanism is a belt gear.

11. The apparatus according to claim 1, wherein the rotating shaft has an external gear extending about the rotating shaft.

12. The apparatus according to claim 1, further comprising a belt gear in driving communication with the rotating shaft.

13. The apparatus according to claim 1, wherein the pins driven by the pin driving device are positioned radially externally and outside of the rotating shaft.

14. The apparatus according to claim 13, further comprising a rotation reset sensor that provides for a reset of the relative position of pin receiving holes in the absorbing hot plate and the pins.

15. The apparatus according to claim 2, further comprising a rotation reset sensor that provides for movement of the transmission mechanism so as to reset the relative positioning of pin receiving holes in the absorbing hot plate and the pins.

16. The apparatus according to claim 15, wherein the transmission mechanism is a belt transmission device.

* * * * *